United States Patent [19]

Tokunaga et al.

[11] 4,058,741
[45] Nov. 15, 1977

[54] SEMICONDUCTOR SWITCH CIRCUIT

[75] Inventors: Michio Tokunaga, Zushi; Ichiro Ohhinata, Yokohama; Shinzi Okuhara, Fujisawa, all of Japan

[73] Assignee: Hitachi, Ltd., Japan

[21] Appl. No.: 704,981

[22] Filed: July 13, 1976

[30] Foreign Application Priority Data

July 14, 1975 Japan .................................. 50-85388

[51] Int. Cl.² ........................................... H03K 17/72
[52] U.S. Cl. ............................. 307/252 G; 307/252 T; 307/305
[58] Field of Search .......... 307/252 R, 252 A, 252 D, 307/252 G, 252 N, 252 T; 357/37; 307/305

[56] References Cited
U.S. PATENT DOCUMENTS 3,307,049  2/1967  von Bernuth et al. ........... 307/252 G Primary Examiner—John Zazworsky
Attorney, Agent, or Firm—Craig & Antonelli

[57] ABSTRACT

A semiconductor switch is composed of at least a 4-terminal PNPN switch. The cathode gate and the anode gate of the PNPN switch are connected to a current-supplying type constant-current circuit with a power supply for feeding a current into the cathode gate and to a current-sinking type constant-current circuit without any power supply for taking out a current from the anode gate, respectively. A change-over circuit is connected between both the constant-current circuits for automatically selecting a path of a drive current from the current-supplying type constant-current circuit to either selected one of the cathode gate and the anode gate or the current-sinking type constant-current circuit in response to the electrical potential of the PNPN switch. The semiconductor switch circuit composed of the 4-terminal PNPN switch may be thus controlled economically with a single power supply without any wasteful power consumption.

7 Claims, 5 Drawing Figures

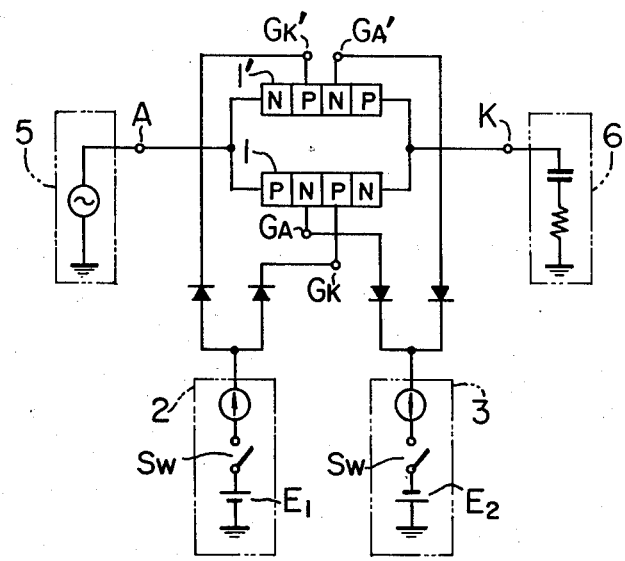
FIG.I
PRIOR ART
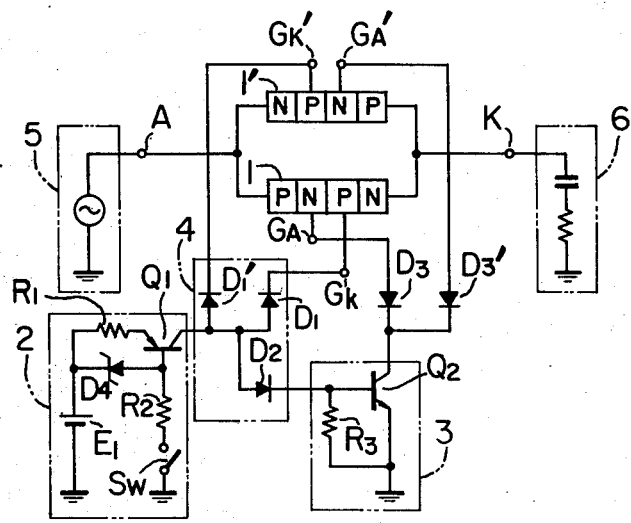
FIG.2

SEMICONDUCTOR SWITCH CIRCUIT

This invention relates to a semiconductor switch circuit with at least a 4-terminal PNPN switch used for a telephone exchange system or the like and capable of passing a continuous DC or AC signal.

In a conventional semiconductor switch circuit with 4-terminal PNPN switches for switching AC signals, a bilateral switch is made up of a couple of PNPN switches connected in inverse-parallel, so that by feeding a current from a drive circuit into the cathode gates of the PNPN switches, a signal is passed. The semiconductor switch circuit with this construction has a disadvantage that, when the AC signal is passed, the voltage of the drive circuit is required to exceed the maximum value of the signal voltage depending on the load involved.

In order to obviate this disadvantage, the inventors previously invented a semiconductor switch circuit, according to which a couple of 4-terminal PNPN switches each with a cathode gate and an anode gate are connected in inverse-parallel to constitute a bilateral switch. The cathode gate of each of the 4-terminal PNPN switches making up the bilateral switch is connected with a cathode gate drive circuit having a positive power supply for feeding a current into the cathode gate, while the anode gate of each of the 4-terminal PNPN switches is connected with an anode gate drive circuit having a negative power supply for taking out a current from the anode gate. A gate current is caused to flow continuously with a small drive voltage irrespective of the amplitude of the signal voltage. Even when the AC signal current is reduced below a self-holding current value of the PNPN switches, the AC signal current is passed through the semiconductor switch circuit without any momentary interruption.

This semiconductor switch circuit is uneconomical in view of the two power supplies, positive and negative, being used. Another drawback is the continuous power consumption by the gate circuits.

Accordingly, it is an object of the present invention to provide an economical semiconductor switch circuit with at least a PNPN switch which is capable of driving both cathode gates and anode gates with a single power supply.

Another object of the invention is to provide a semiconductor switch circuit in which a cathode gate drive circuit and an anode gate drive circuit are operatively changed over to each other automatically in response to the potential of the PNPN switches, thus saving power consumption.

The semiconductor switch circuit according to the present invention comprises at least a 4-terminal PNPN switch having a cathode gate and an anode gate, first drive circuit means for feeding a current into the cathode gate of the PNPN switch, second drive circuit means for taking out a current from the anode gate of the PNPN switch, selected one of the first drive circuit means and the second drive circuit means having a power supply, and change-over means connected between the first drive circuit means and the second drive circuit means for selecting a path of the drive current from the first drive circuit means with the power supply to either selected one of the cathode gate and the anode gate of the PNPN switch or the drive circuit means without any power supply in response to the potential of the PNPN switch.

The above and other objects, features and advantages will be made apparent by the detailed description taken in conjunction with the accompanying drawings, in which:

FIG. 1 is a diagram showing a conventional semiconductor switch circuit with 4-terminal PNPN switches, most analogous to the present invention and previously invented by the present inventors.

FIG. 2 is a diagram showing a circuit configuration of a first embodiment of the semiconductor switch circuit according to the present invention.

Figure 3:
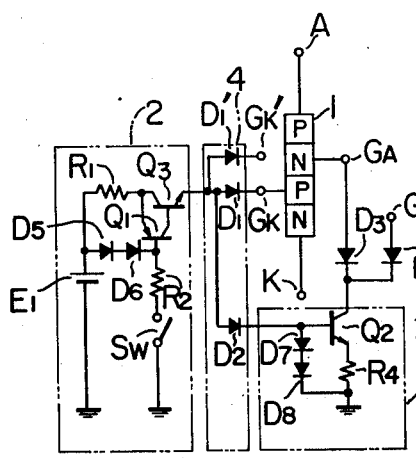
FIGS. 3 to 5 show circuit configurations of other embodiments of the invention.

Prior to entering into description of specific embodiments of the invention, the semiconductor switch circuit previously invented by the present inventors and most analogous to the present invention will be explained with reference to FIG. 1.

The semiconductor switch circuit shown in FIG. 1 comprises a bilateral switch including a couple of 4-terminal PNPN switches having cathode gates $G_K$, $G_K'$ and anode gates $G_A$, $G_A'$ and connected in inverse-parallel. This bilateral switch is connected to a current-supplying type constant-current drive circuit with a positive power supply, as a cathode gate drive circuit 2, and also to a current-sinking type constant-current drive circuit with a negative power supply, as an anode gate drive circuit 3. A gate current is thus made to flow with a low drive voltage irrespective of the potential of the PNPN switches 1 and 1' caused by the main signal. In spite of this, this semiconductor switch circuit is uneconomical in view of the two power supplies employed. Another uneconomical point of this circuit is that the two gate circuits always consume power. Indeed, it suffices if a gate current flows only in one of the gate circuits at a time.

A first embodiment of the semiconductor switch circuit according to the present invention is shown in FIG. 2. Reference numerals 1 and 1' designate 4-terminal PNPN switches having cathode gates $G_K$, $G_K'$ and anode gates $G_A$, $G_A'$. Numeral 2 designates a current-supplying type constant-current circuit including a PNP transistor $Q_1$, a constant-voltage diode $D_4$, resistors $R_1$, $R_2$, a power supply $E_1$ and a switch SW. Numeral 3 designates a current-sinking type constant-current circuit including an NPN transistor $Q_2$ and a resistor $R_3$. Numeral 4 designates a circuit including diodes $D_1$, $D_1'$ and $D_2$ for blocking reverse current and automatically selecting one of the anode gate drive and the cathode gate drive in response to the potential of the PNPN switch 1. Reference characters $D_3$ and $D_3'$ designated reverse-current blocking diodes. Numeral 5 designates a signal source, and numeral 6 a capacitive load. According to this circuit configuration, when the potential of the cathode of the PNPN switch 1 or 1' is negative, the corresponding one of the diodes $D_1$ and $D_1'$ is turned on, so that the current from the current-supplying type constant-current circuit 2 flows into the corresponding one of the cathode gates $G_K$ and $G_K'$ of the PNPN switches 1 and 1'. Under this condition, the emitter current of the PNP transistor $Q_1$ is dependent on the constant-voltage diode $D_4$ and the resistor $R_1$. If the current amplification factor of the PNP transistor $Q_1$ is sufficiently high, the emitter current is almost equal to the collector current, and therefore the cathode drive current, which is the collector current of the PNP transistor $Q_1$, is a constant current determined substantially by the constant voltage diode $D_4$ and the resistor $R_1$. In other words, the cathode drive current $I_{GK}$ is approximately expressed as $$I_{GK} \approx [(V_{D4} - V_{BEQ_1}/R_1] \cdot \alpha_{Q_1} \quad (1)$$

where: $V_{D4}$ is the constant voltage value of the diode $D_4$; $V_{BEQ_1}$ is the base-emmiter forward voltage ($\approx$ 0.7V) of the transistor $Q_1$; and $\alpha_{Q_1}$ is the base-grounded current amplification factor of the transistor $Q_1$.

Assuming that $V_{D4} >> V_{BEQ_1}$ and $\alpha_{Q_1} \approx 1$ is equation (1).

$$I_{GK} \approx V_{D4}/R_1 \quad (2)$$

On the other hand, the diode $D_2$ is turned off and therefore the current-sinking type constant-current circuit 3 is not energized, resulting in no power being consumed by it as an anode gate drive circuit. When the potential of the cathodes of the PNPN switches 1 and 1' is positive, by contrast, the diode $D_2$ is turned on, while the diodes $D_1$ and $D_1'$ are turned off. The cathode gate GK nor GK' is driven, so that the current from the current-supplying type constant-current circuit 2 flows into the current-sinking type constant-current circuit 3 via the diode $D_2$. As a result, the anode gates $G_A$ and $G_A'$ of the PNPN switches 1 and 1' are driven.

Under this condition, the anode gate drive current is determined by the cathode gate drive constant current $I_{GK}$ shown in equation (1), the resistor $R_3$ and the emitter-grounded current amplification factor of the transistor $Q_2$.

By approximate calculation, the anode gate drive current $I_{GA}$ is given as $$I_{GA} \approx I_{GK} = (V_{BEQ_2}/R_3)] \cdot \beta_{Q_2} \quad (3)$$

where: $V_{BEQ_2}$ is the base-emitter forward voltage ($\approx$ 0.7V) of the transistor $Q_2$; and $\beta_{Q_2}$ is the emitter-grounded current amplification factor of the transistor $Q_2$. In this way, the cathode gate $G_K$ and the anode gate $G_A$ are driven respectively when the potential of the PNPN switch 1 is negative and positive, so that a high voltage is not required for the drive power supply $E_1$.

The circuit configurations of the current-supplying type constant-current circuit 2 and the current-sinking type constant current circuit 3 are not limited to those shown in FIG. 2 but may assume various forms. The circuit configuration shown in FIG. 3, for example, is suitable for semiconductor circuit integration.

In the circuit of FIG. 3, a couple of 4-terminal PNPN switches are connected in inverse-parallel, although only one of such switches is shown for the sake of simplification. The cathode gates of these switches are connected to the diodes $D_1$ and $D_1'$ whose anodes are in turn connected to each other in the same manner as the embodiment of FIG. 2. This is also the case with the embodiments of FIGS. 4 and 5. If this drive circuit takes the form of an integrated circuit, the PNP transistor of lateral type is generally employed, thus making it impossible to obtain a high current amplification factor $\alpha_{Q_1}$. In such a case, the PNP transistor $Q_1$ and the NPN transistor $Q_3$ may be connected in Darlington pair as shown in FIG. 3 to increase the equivalent current amplification factor, thereby reducing the variation in the gate drive current which otherwise might result from the variation in the current amplification factor. Although not shown in the drawing, a resistor $R_{GK}$ is generally inserted between the cathode gate $G_K$ and the cathode K in order to prevent the dv/dt effect whereby the PNPN switch 1 is erroneously turned on in response to a transient voltage applied between the anode A and the cathode K thereof. In this connection, the cathode gate sensitivity (minimum firing current) is given approximately as $V_{GK}/R_{GK}$, where $V_{GK}$ is the gate-cathode forward voltage ($\approx$ 0.7V). In this case, by taking advantage of the forward characteristics of the diodes $D_5$ and $D_6$ shown in FIG. 3 in place of the constant voltage diode $D_4$ in FIG. 2, it is possible to compensate for the variation in the forward voltage drop in the PN junction and resistance as well as the variation in gate sensitivity due to temperature characteristics. Thus, $I_{GK}$ is almost equal to $V_F/R_1$. As seen from this equation, the cathode gate drive current $I_{GK}$, like the gate sensitivity, may be expressed as the ratio of the forward voltage drop $V_F (\approx 0.7V)$ in the PN junction to the resistance. This means the possibility of compensation for the deviation of the gate sensitivity and the drive current in view of the fact that although a semiconductor integrated circuit is generally accompanied by the variation as large as 20 to 30% in the absolute value of resistance, the relative value of resistance in the same chip is subjected to variation as small as less than 5%, that the forward voltage drop $V_F$ in the PN junction has a small variation, and that the respective resistors $R_1$ and $R_{GK}$ have same temperature coefficiency and the respective forward voltage drop $V_{GK}$ and $V_F$ have the same temperature coefficiency.

As to the current-absorbing type constant-current circuit 3, on the other hand, the circuit configuration of FIG. 2 is such that the variation of the current amplification factor of the NPN transistor $Q_2$ causes the variation of the anode gate current. In the circuit of FIG. 3, however, the current value is dependent on the diodes $D_7$ and $D_8$ and the resistor $R_4$, and therefore it is possible to effect the anode gate drive with a stable current. Depending on the interconnection of the semiconductor integrated circuit, a multi-emitter transistor may be employed as the NPN transistor $Q_3$ so that the diodes $D_1$ and $D_2$ are connected to respective emitters thereof for performing similar switching operation. Further, the diodes $D_1$ and $D_2$ may be connected in cascade in several stages when their function of blocking reverse current requires a high breakdown voltage. Unlike this embodiment using a positive power supply, a complementary circuit configuration is made possible by using a negative power supply $E_2$ as shown in FIG. 4.

Figure 4:
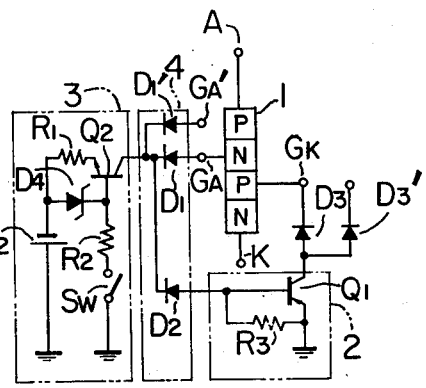
Figure 5:
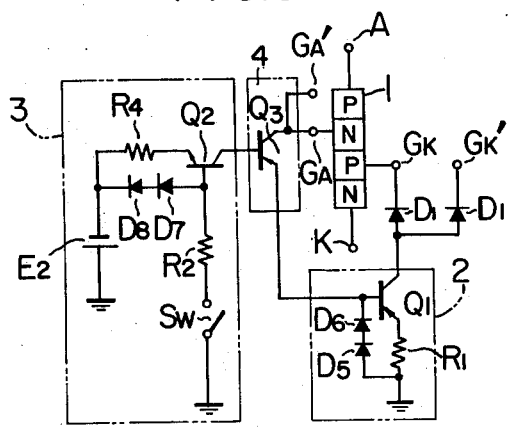

The diagram of FIG. 5 shows a circuit configuration which is, like the circuit of FIG. 3, suitable for semiconductor circuit integration of the fundamental construction of FIG. 4. In this circuit, the constant voltage sections of the constant current circuits 2 and 3 utilize the forward voltage drop in the diodes $D_5$, $D_6$ and $D_7$, $D_8$, thereby compensating for the variations in gate sensitivity and drive current due to resistance change, the manufacturing variation of the constant-voltage diodes and temperature changes. Furthermore, the change-over circuit 4 may be composed of a lateral type PNP transistor $Q_3$ used for a semiconductor integrated circuit. This lateral type PNP transistor $Q_3$ is equivalent to a couple of diodes formed in the same isolated region of a semiconductor integrated circuit, and, being less in occupied space, is more economical than two diodes being formed in different isolated regions. In the above-mentioned recommended construction, when the potential of the PNPN switch 1 is positive, the anode gate $G_A$ is driven and the transistor $Q_3$ of the change-over circuit 4 enters into a reverse operating mode in which the emitter-base junction thereof is reverse biased. As a result, the current-supplying type constant-current circuit 2 is turned off. When the potential of the PNPN switch 1 is negative, on the other hand, the transistor $Q_3$ of the change-over circuit 4 enters into a forward operating mode in which the collector-base junction thereof is reverse biased. The result is that the cathode gate $G_K$ is driven, while a reverse current flows into the anode gate $G_A$ through the transistor $Q_3$. This reverse current is almost negligible since the current amplification factor of the PNP transistor $Q_3$ which is a lateral type transistor is easily reduced.

It will be understood from the foregoing description that according to the invention the current-supplying type constant-current circuit 2 is connected to the current-sinking type constant-current circuit 3 by a change-over circuit for automatic charge-over operation in accordance with the potential of the PNPN switch 1, thereby making possible an economical semiconductor switch circuit having 4-terminal PNPN switches which operates on small power consumption with a single power supply.

What is claimed is:

1. A semiconductor switch circuit comprising:
   at least a 4-terminal PNPN switch having a cathode gate and an anode gate;
   first drive circuit means for feeding a current into the cathode gate of said PNPN switch;
   second drive circuit means for taking out a current from the anode gate of said PNPN switch, selected one of said first drive circuit means and said second drive circuit means having a power supply; and
   change-over means, connected between said first drive circuit means and said second drive circuit means, for selecting a path of a drive current from said drive circuit means with said power supply to either selected one of the cathode gate and the anode gate of said PNPN switch or said drive circuit means without said power supply in response to a potential of one of the cathode gate and anode gate of said PNPN switch.

2. A semiconductor switch circuit according to claim 1 wherein said change-over means includes a PNP transistor.

3. A semiconductor switch circuit according to claim 1 wherein each of said first drive circuit means and said second drive circuit means includes a constant-current circuit.

4. A semiconductor switch circuit comprising:
   a bilateral switch including a couple of 4-terminal PNPN switches connected in inverse-parallel, each having a cathode gate and an anode gate;
   first drive circuit means for feeding a current into the cathode gates of said bilateral switch;
   second drive circuit means for taking out a current from the anode gates of said bilateral switch, selected one of said first drive circuit and said second drive circuit means having a power supply; and
   change-over means, connected between said first drive circuit means and said second drive circuit means, for selecting a path of a drive current from said drive circuit means with said power supply to either selected one of the cathode gates and the anode gates of said bilateral switch or said drive circuit means without said power supply in response to a potential of one of the cathode gate and anode gate of said PNPN switch.

5. A semiconductor switch circuit according to claim 4 wherein said change-over means includes a PNP transistor.

6. A semiconductor switch circuit according to claim 4 wherein each of said first drive circuit means and said second drive circuit means includes a constant-current circuit.

7. A semiconductor switch circuit according to claim 4, wherein said change-over means includes at least a pair of diodes, an electrode of one of said diodes being connected with an electrode of the other diode, which electrode of the other diode has the same polarity as said electrode of said one of said diodes.

* * * * *